(12) United States Patent
Yoshikawa

(10) Patent No.: US 6,424,240 B1
(45) Date of Patent: Jul. 23, 2002

(54) SURFACE ACOUSTIC WAVE FILTER DEVICE WITH A SHARED REFLECTOR AND PORTABLE TELEPHONE COMPRISING SAME

(75) Inventor: Shuichi Yoshikawa, Sennan (JP)

(73) Assignees: Sanyo Electric Co., Ltd.; Sanyo Electronic Components Co., Ltd., both of Osaka (JP)

( * ) Notice: Subject to any disclaimer, the term of this patent is extended or adjusted under 35 U.S.C. 154(b) by 0 days.

(21) Appl. No.: 09/535,803

(22) Filed: Mar. 28, 2000

(30) Foreign Application Priority Data

Mar. 29, 1999 (JP) .............................. 11-087159

(51) Int. Cl.[7] .............................. H03H 9/64; H04B 1/16; H04B 1/44
(52) U.S. Cl. ..................... 333/195; 333/133; 310/313 D; 455/83; 455/334
(58) Field of Search ..................... 333/133, 193–196; 310/313 R, 313 B, 313 C, 313 D; 455/83, 334

(56) References Cited

U.S. PATENT DOCUMENTS 3,970,970 A * 7/1976 Worley ........................ 333/195
5,638,036 A * 6/1997 Penunuri et al. ........ 333/195 X
5,864,260 A * 1/1999 Lee .............................. 333/133
5,929,724 A * 7/1999 D'Souza ..................... 333/193
5,952,899 A * 9/1999 Kadota et al. .......... 333/133 X

FOREIGN PATENT DOCUMENTS

| JP | 8-265099 | * 10/1996 |
| JP | 9-181565 | * 7/1997 |
| JP | 2000-201048 | * 7/2000 |

* cited by examiner

*Primary Examiner*—Benny Lee
*Assistant Examiner*—Barbara Summons
(74) *Attorney, Agent, or Firm*—Rader, Fishman & Grauer, PLLC

(57) ABSTRACT

A surface acoustic wave filter device comprising a plurality of surface acoustic wave filters 3, 51, 52 formed on a common piezoelectric substrate 13, each of the surface acoustic wave filters comprising, as arranged on a surface of the piezoelectric substrate 13, a plurality of interdigital electrodes 31–33, 53–55, 56–58 and grating reflectors 61, 67, 64, 65, 66 at opposite sides of the electrode arrangement with respect to the direction of propagation of surface acoustic waves. The two surface acoustic wave filters 3, 51 which are adjacent to each other share one grating reflector 67 as the grating reflector to be disposed at one of the opposite sides of the electrode arrangement of each of the adjacent filters, whereby the device can be made more compact than conventionally without greatly altering the design of the filters or impairing the performance thereof.

6 Claims, 5 Drawing Sheets

FIG. 4 (a) PRIOR ART
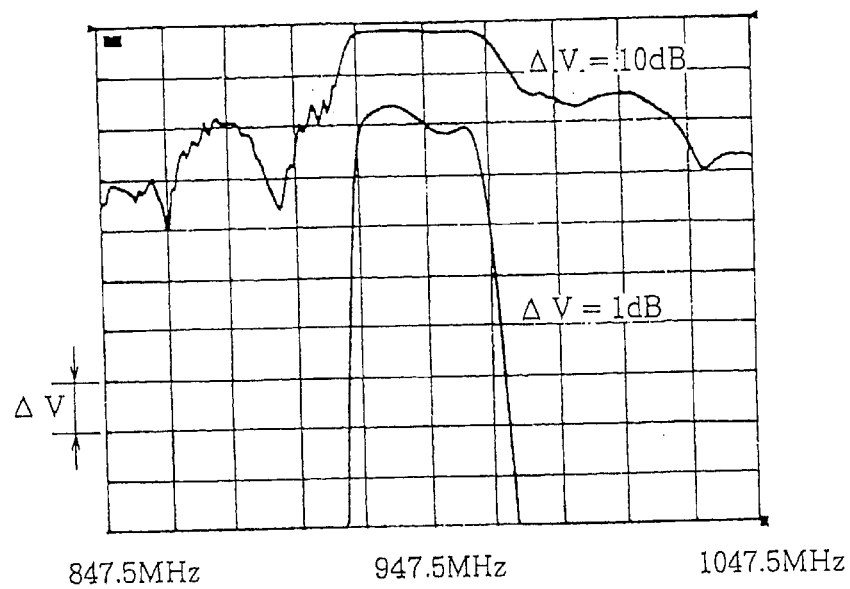
FIG. 4 (b) PRIOR ART
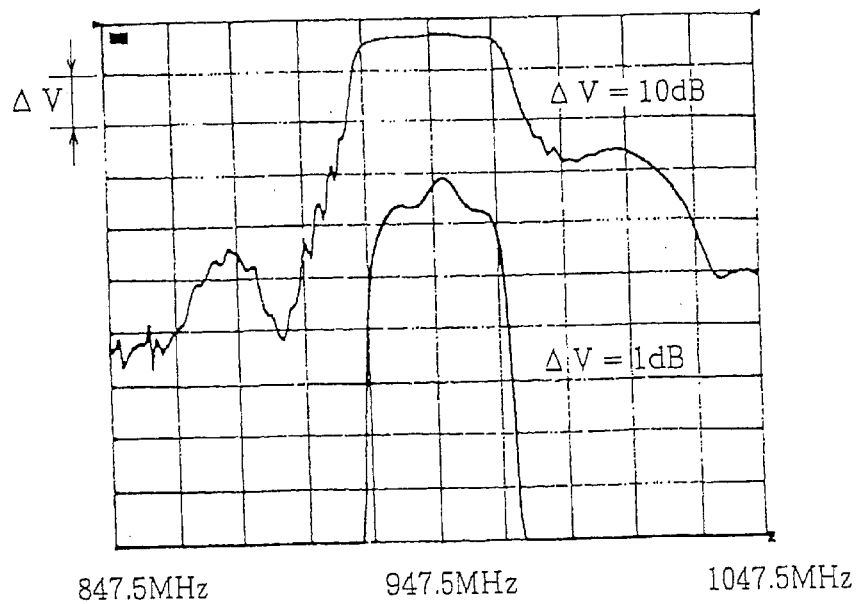

SURFACE ACOUSTIC WAVE FILTER DEVICE WITH A SHARED REFLECTOR AND PORTABLE TELEPHONE COMPRISING SAME

FIELD OF THE INVENTION

The present invention relates to surface acoustic wave filter devices comprising a plurality of surface acoustic wave filters formed on a common substrate and to portable telephones comprising the filter device.

BACKGROUND OF THE INVENTION

With reference to FIG. 5, digital portable telephones, for example, of the GSM (global system for mobile communication) type comprise a receiving circuit and a transmitting circuit which are connected to an antenna 1 by way of a change-over switch 2. The receiving circuit comprises a front filter 3, amplifier 4, interstage filter 5, first mixer 6, rear filter 7 and second mixer 8 which are connected to one another in series, while the transmitting circuit comprises a QPSK modulator 9, interstage filter 10, amplifier 11 and rear filter 12 which are connected to one another in series.

The front filter 3 and the interstage filter 5 of the receiving circuit each comprise a surface acoustic wave filter having a center frequency of 947.5 MHz. Used as the front filter 3 is a low-loss filter which is low in insertion loss. The interstage filter 5 is a highly suppressive filter which greatly attenuates the outside of the pass band.

To meet a demand for more compact portable telephones in recent years, the front filter 3 and the interstage filter 5 of the receiving circuit are formed on a common substrate to provide a surface acoustic wave device 14 in the form of a single package.

FIG. 3 shows the construction of this surface acoustic wave device 14. The front filter 3 and the interstage filter 5 are formed on a common piezoelectric substrate 13. The front filter 3 is a primary-tertiary longitudinal coupled double mode surface acoustic wave filter comprising three interdigital electrodes 31, 32, 33 and grating reflectors 61, 62 disposed respectively at opposite sides of the electrode arrangement. An input signal is fed to an input terminal (1) from the antenna 1 via the change-over switch 2, while an output terminal (1) delivers an output signal to the amplifier 4.

The receiving-side interstage filter 5 has a two-stage structure, i.e., a first filter stage 51 and a second filter stage 52. The first filter stage 51 is a primary-tertiary longitudinal coupled double mode surface acoustic wave filter comprising three interdigital electrodes 53, 54, 55 and grating reflectors 63, 64 disposed respectively at opposite sides of the electrode arrangement, and has an input terminal (2) for receiving a signal output from the amplifier 4. The second filter stage 52 is a primary-tertiary longitudinal coupled double mode surface acoustic wave filter comprising three interdigital electrodes 56, 57, 58 and grating reflectors 65, 66 disposed respectively at opposite sides of the electrode arrangement, and has an output terminal (2) for feeding a signal output to the mixer 6.

The piezoelectric substrate 13 provided with the front filter 3 and the interstage filter 5 thereon as stated above is enclosed in, and provided as, a single package. The package is mountable on a circuit board over a smaller area than when the filters are each enclosed in a package, serving to provide a compacted portable telephone.

However, it has been required with ever increasing severity to compact portable telephones. Attempts to provide conventional surface acoustic wave filter devices in more compact packages necessitate a modification such as a reduction in the aperture width of interdigital electrodes or in the number of digits thereof, or provision of the receiving-side interstage filter 5 by a single stage, consequently entailing not only a need for a great alteration in design but also performance problems such as lower characteristics in the pass band and impaired attenuation characteristics outside the pass band.

SUMMARY OF THE INVENTION

An object of the present invention is to provide a surface acoustic wave filter device which can be more compacted than conventionally without resulting in a great design alteration or impaired performance, and a portable telephone having the filter device incorporated therein.

The present invention provides a surface acoustic wave filter device comprising a plurality of surface acoustic wave filters formed on a common substrate, each of the surface acounstic wave filters comprising, as arranged on a surface of a piezoelectric layer formed at a surface layer portion of the substrate, at least one interdigital electrode and a grating reflector disposed at each of opposite sides of the interdigital electrode with respect to the direction of propagation of surface acoustic waves.

At least two of the surface acoustic wave filters of the device which are adjacent to each other share one grating reflector as the grating reflector to be disposed at one of the opposite sides of the interdigital electrode of each of the adjacent filters.

Stated more specifically, each of the surface acoustic wave filters is a primary-tertiary longitudinal coupled double mode surface acoustic wave filter comprising an arrangement of three interdigital electrodes and a grating reflector disposed at each of opposite sides of the electrode arrangement.

With the surface acoustic wave filter device of the invention described, the two adjacent filers share one grating reflector, so that the device can be made more compact than the conventional device wherein two grating reflectors are arranged to provide each filter, by an amount corresponding to a reduction in the total number of grating reflectors.

We have substantiated by experiments that the common use of the grating reflector does not result in lower characteristics in the path band or impaired attenuation characteristics outside the pass band, provided that the grating reflectors originally used individually are identical in aperture width, digit pitch and duty.

The present invention also provides a portable telephone comprising a receiving circuit and a transmitting circuit which are connected to an antenna 1 by way of a change-over switch 2, the receiving circuit comprising a front filter 3, an amplifier 4 and an interstage filter 5 which are connected in series with an output terminal of the change-over switch 2. The front filter 3 and the interstage filter 5 each comprise one or a plurality of surface acoustic wave filters, each of the surface acoustic wave filters comprising, as arranged on a surface of a piezoelectric layer formed at a surface layer portion of a common substrate, at least one interdigital electrode and a grating reflector disposed at each of opposite sides of the interdigital electrode with respect to the direction of propagation of surface acoustic waves. At least two of the surface acoustic wave filters which are adjacent to each other share one grating reflector as the grating reflector to be disposed at one of the opposite sides of the interdigital electrode of each of the adjacent filters.

The portable telephone of the invention includes the construction of surface acoustic wave filter device of the invention for the front filter 3 and the interstage filter 5 of the receiving circuit, whereby the filter device comprising the front filter 3 and the interstage filter 5 can be made compact, consequently making it possible to provide a compacted portable telephone.

The front filter 3 comprises a single stage of surface acoustic wave filter to afford satisfactory low-loss characteristics in the pass band, while the interstage filter 5 is composed of two stages, i.e., a first filter stage 51 and a second filter stage 52, which are connected in series, and a surface acoustic wave filter which is equivalent to the front filter 3 in characteristics is used for each of the filter stages. This makes it possible to render one grating reflector of the front filter 3 and one grating filter of one stage of the interstage filter 5 identical with each other in aperture width, digit pitch and duty, consequently permitting common use of one grating filter for these two reflectors.

With the surface acoustic wave filter device and the portable telephone or cellular phone of the invention, two adjacent surface acoustic wave filters are made to share a grating reflector to provide a compacted surface acoustic wave filter device wherein these filters are used in the form of a single package. Since no modification is made in the interdigital electrodes which govern the characteristics of the filters, the invention provides a more compacted device than the prior art without entailing a great alteration in design or impairing the performance.

BRIEF DESCRIPTION OF THE DRAWINGS

FIGS. 4(a) and 4(b) are graphs showing the characteristics of a front filter and an interstage filter of the device.

DETAILED DESCRIPTION OF EMBODIMENT

Figure 1:
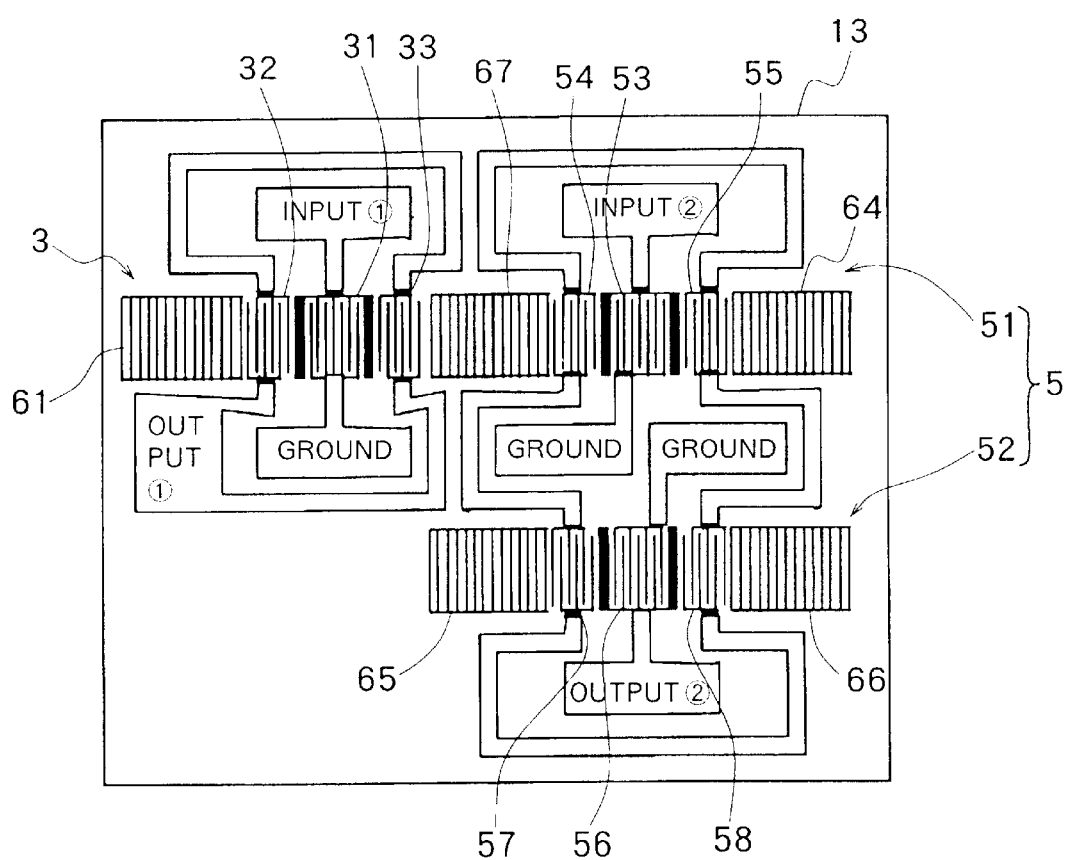
FIG. 1 is a plan view of a surface acoustic wave filter device of the present invention.
Figure 5:
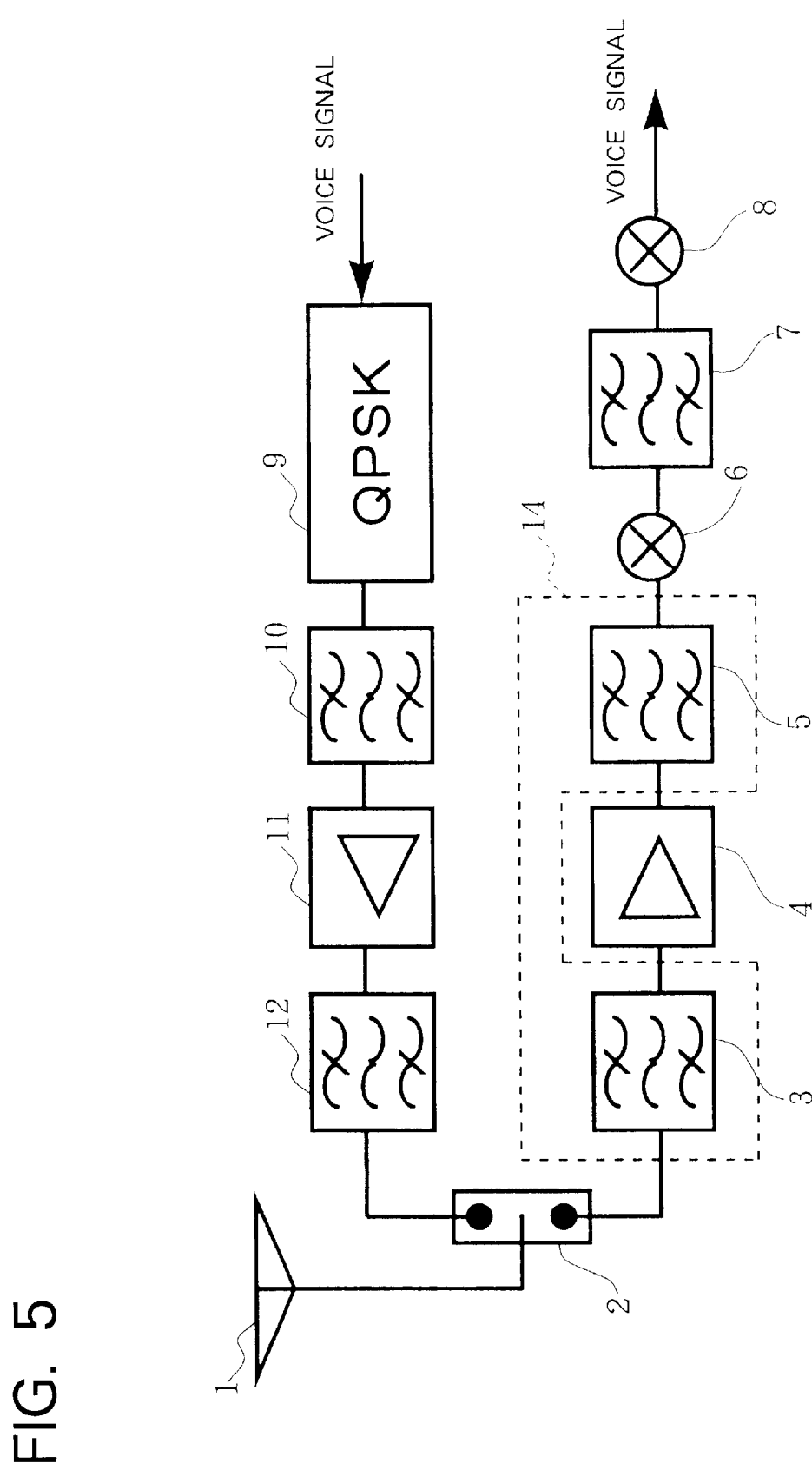
FIG. 5 is a block diagram showing the construction of a portable telephone.

With reference to the drawings, a detailed description will be given below of the present invention as applied to a cellular or portable telephone shown in FIG. 5. The portable telephone shown in FIG. 5 has a receiving circuit comprising a front filter 3, amplifier 4, interstage filter 5, first mixer 6, rear filter 7 and second mixer 8. The front filter 3 and the interstage filter 5 of the receiving circuit are formed on a common piezoelectric substrate 13 as shown in FIG. 1 and are made into a single package. The front filter 3 and the interstage filter 5 each have a center frequency of 947.5 MHz.

The front filter 3 is a primary-tertiary longitudinal coupled double mode surface acoustic wave filter comprising three interdigital electrodes 31, 32, 33 and grating reflectors 61, 67 disposed respectively at opposite sides of the electrode arrangement, and has an input terminal (1) for receiving an input signal from an antenna 1 via a change-over switch 2, and an output terminal (1) for delivering an output signal to the amplifier 4.

The receiving-side interstage filter 5 has a two-stage structure, i.e., a first filter stage 51 and a second filter stage 52. The first filter stage 51 is a primary-tertiary longitudinal coupled double mode surface acoustic wave filter comprising three interdigital electrodes 53, 54, 55 and grating reflectors 67, 64 disposed respectively at opposite sides of the electrode arrangement, and has an input terminal (2) for receiving a signal output from the amplifier 4. The second filter stage 52 is a primary-tertiary longitudinal coupled double mode surface acoustic wave filter comprising three interdigital electrodes 56, 57, 58 and grating reflectors 65, 66 disposed respectively at opposite sides of the electrode arrangement, and has an output terminal (2) for feeding a signal output to the mixer 6.

Thus, the front filter 3 comprises a single stage of surface acoustic wave filter and is given satisfactory low-loss pass characteristics within the pass band. On the other hand, the interstage filter 5 comprises two stages, i.e., first filter stage 51 and second filter state 52, which are connected in series and is given attenuation characteristics sufficient to obtain high selectivity at the pass band side.

A surface acoustic wave filter equivalent to the front filter 3 in characteristics is used as each of the filter stages 51, 52 of the receiving-side interstage filter 5. This renders the grating reflector 61 of the front filter 3 identical with the grating reflector 64 of the first filter stage 51 of the interstage filter 5 in aperture width, digit pitch and duty, further making it possible to use the grating reflector 67 in common.

In the case where two filters sharing one grating reflector are different in the number of digits of the other grating reflector, for example, when the grating reflector 61 of the front filter 3 and the grating reflector 64 of first filter stage 51 of the interstage filter 5 are different in the number of digits in the case of the above portable telephone, it is assumed that the numbers of digits of these reflectors have the following relationship:

$$0.5 \times \min(m,n) \leq k \leq 1.5 \times \max(m,n)$$

wherein m is the number of digits of the grating reflector 61 of the front filter 3, n is the number of digits of the grating reflector 64 of the interstage filter 5, and k is the number of digit of the common grating reflector 67.

Thus, the number of digits of the common grating reflector 67 is at least 0.5 times the smaller of the numbers m and n of digits of the grating reflectors 61, 64 which are not common to not greater than 1.5 times the greater of the numbers m and n of digits, whereby the impairment of the performance due to the common use of the grating reflector 67 can be prevented reliably. According to the present embodiment, the grating reflectors 61, 67, 64, 65 and 66 each have 140 digits.

Figure 2:
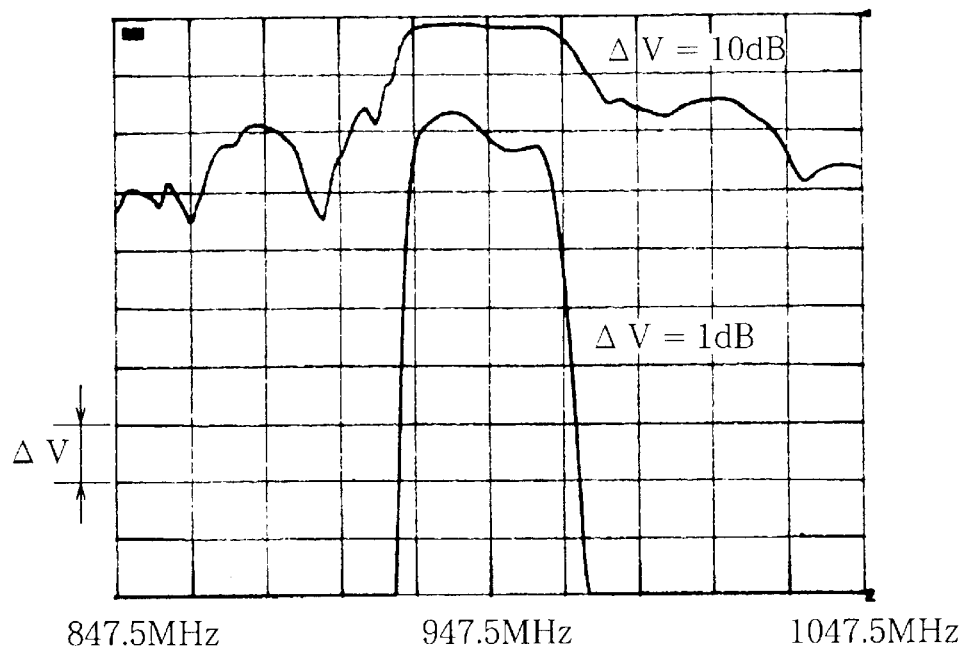
FIGS. 2(a) and 2(b) are graphs showing the characteristics of a front filter and an interstage filter of the device.
Figure 2:
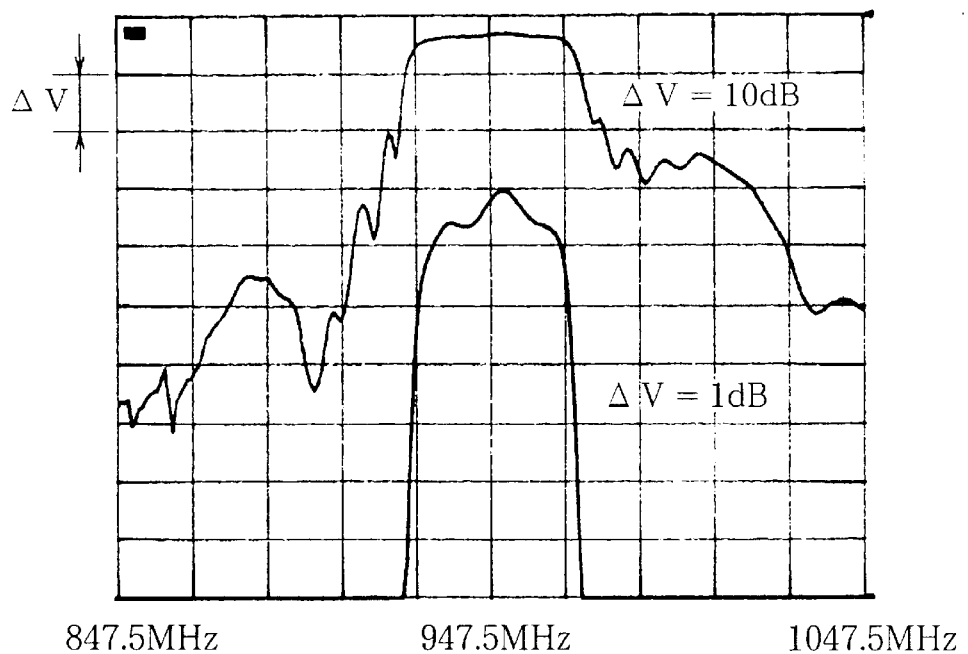

FIG. 2 shows the characteristics (a) and (b) of the respective front filter 3 and interstage filter 5 having the grating reflector 67 in common and included in the surface acoustic wave filter device of FIG. 1. On the other hand, FIG. 4 shows the characteristics (a) and (b) of the respective front filter 3 and interstage filter 5 sharing no grating reflector and included in the surface acoustic wave filter device of FIG. 3.

These drawings reveal that the common use of the grating reflector 67 produces no substantial difference between the receiving-side filter 3 and the receiving-side interstage filter 5 in insertion loss values at 915 MHz, 935 MHz, 960 MHz and 980 MHz which are representative of characteristics in the pass band and attenuation characteristics outside the pass band. The common use of the grating reflector 67 therefore entails no problem with respect to the filter characteristics.

Figure 3:
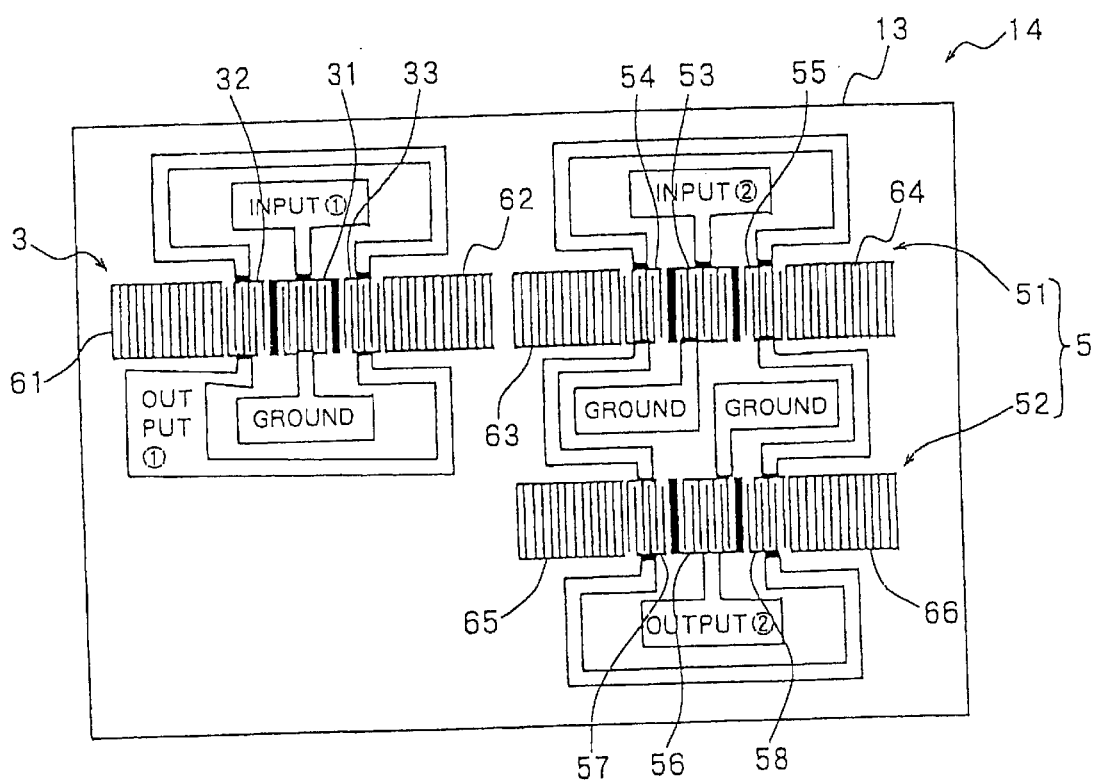
FIG. 3 is a plan view of a conventional surface acoustic wave filter device.

The surface acoustic wave filter device shown in FIG. 1 and embodying the invention is smaller by one than the conventional device shown in FIG. 3 in the number of grating reflectors and therefore serves to achieve a corresponding reduction in the size of the piezoelectric substrate 13. For example, the conventional chip size is 1.8 mm×2.4 mm, whereas the invention reduces the chip size to 1.8 mm×2.0 mm. This renders the package smaller in size, consequently realizing a more compact portable telephone.

The device of the invention is not limited to the foregoing embodiment in construction but can be modified variously by one skilled in the art without departing from the spirit of the invention as set forth in the appended claims.

What is claimed is:

1. A surface acoustic wave filter device comprising:

a plurality of surface acoustic wave filters formed on a common substrate, each of the surface acoustic wave filters comprising, as arranged on a surface of a piezoelectric layer formed at a surface layer portion of the substrate, at least one interdigital electrode and a grating reflector disposed at each of opposite sides of the interdigital electrode with respect to the direction of propagation of surface acoustic waves, the filter device being characterized in that at least two of the surface acoustic wave filters which are adjacent to each other share one grating reflector as the grating reflector to be disposed at one of the opposite sides of the interdigital electrode of each of the adjacent filters, each of the adjacent filters has one input terminal for receiving an input signal from outside of the substrate and one output terminal for delivering an output signal to outside of the substrate.

2. A surface acoustic wave filter device according to claim 1 wherein each of the surface acoustic wave filters is a primary-tertiary longitudinal coupled double mode surface acoustic wave filter comprising an arrangement of three interdigital electrodes and a grating reflector disposed at each of opposite sides of the electrode arrangement.

3. A surface acoustic wave filter device comprising:

a plurality of surface acoustic wave filters formed on a common substrate, each of the surface acoustic wave filters comprising, as arranged on a surface of a piezoelectric layer formed at a surface layer portion of the substrate, at least one interdigital electrode and a grating reflector disposed at each of opposite sides of the interdigital electrode with respect to the direction of propagation of surface acoustic waves, the filter device being characterized in that at least two of the surface acoustic wave filters which are adjacent to each other share one grating reflector as the grating reflector to be disposed at one of the opposite sides of the interdigital electrode of each of the adjacent filters, wherein digits of the grating reflectors of the two adjacent surface acoustic wave filters having the relationship of:

$$0.5 \times \min(m,n) \leq k \leq 1.5 \times \max(m,n)$$

wherein k is the number of digits of the grating reflector shared by the two filters, m is the number of digits of the other, grating reflector of one of the two filters, and n is the number of digits of the other grating reflector of the other filter.

4. A portable telephone comprising a receiving circuit and a transmitting circuit which are connected to an antenna (1) by way of a change-over switch (2), the receiving circuit comprising a front filter (3), an amplifier (4) and an interstage filter (5) which are connected in series with an output terminal of the change-over switch (2), the front filter (3) and the interstage filter (5) each comprising one or a plurality of surface acoustic wave filters, each of the surface acoustic wave filters comprising, as arranged on a surface of a piezoelectric layer formed at a surface layer portion of a common substrate, at least one interdigital electrode and a grating reflector disposed at each of opposite sides of the interdigital electrode with respect to the direction of propagation of surface acoustic waves, the portable telephone being characterized in that at least two of the surface acoustic wave filters which are adjacent to each other share one grating reflector as the grating reflector to be disposed at one of the opposite sides of the interdigital electrode of each of the adjacent filters.

5. A portable telephone according to claim 4 wherein digits of the grating reflectors of the two adjacent surface acoustic wave filters having the relationship of:

$$0.5 \times \min(m,n) \leq k \leq 1.5 \times \max(m,n)$$

wherein k is the number of digits of the grating reflector shared by the two filters, m is the number of digits of the other grating reflector of one of the two filters, and n is the number of digits of the other grating reflector of the other filter.

6. A surface acoustic wave filter device comprising:

a plurality of surface acoustic wave filters formed on a common substrate, each of the surface acoustic wave filters comprising, as arranged on a surface of a piezoelectric layer formed at a surface layer portion of the substrate, at least one interdigital electrode and a grating reflector disposed at each of opposite sides of the interdigital electrode with respect to the direction of propagation of surface acoustic waves, the filter device being characterized in that at least two of the surface acoustic wave filters which are adjacent to each other share one grating reflector as the grating reflector to be disposed at one of the opposite sides of the interdigital electrode of each of the adjacent filters, wherein each of the surface acoustic wave filters is a primary-tertiary tandem-connected dual-mode surface acoustic wave filter comprising an arrangement of three interdigital electrodes and a grating reflector disposed at each of opposite sides of the electrode arrangement.

* * * * *